(12) United States Patent
Teterud et al.

(10) Patent No.: US 6,614,273 B2
(45) Date of Patent: Sep. 2, 2003

(54) ULTRA-FAST VOLTAGE DRIVE

(75) Inventors: Patrick Teterud, Plano, TX (US); Jiangfeng Wu, Pittsburgh, PA (US); Thomas Van Eaton, Wylie, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/772,776

(22) Filed: Jan. 30, 2001

(65) Prior Publication Data

US 2002/0101267 A1 Aug. 1, 2002

(51) Int. Cl.$^7$ ................................................ G11B 5/03
(52) U.S. Cl. .......................... 327/110; 327/108; 360/66
(58) Field of Search ................................. 327/108, 136, 327/110, 427, 437; 360/59, 66

(56) References Cited

U.S. PATENT DOCUMENTS 5,243,472 A * 9/1993 Molstad ........................ 360/66
5,801,550 A * 9/1998 Tanaka et al. ............... 327/110
6,147,523 A * 11/2000 Hojabri ....................... 327/110
6,285,221 B1 * 9/2001 Leighton et al. ............ 327/110

* cited by examiner

Primary Examiner—Dinh T. Le
(74) Attorney, Agent, or Firm—W. Daniel Swayze, Jr.; W. James Brady; Frederick J. Telecky, Jr.

(57) ABSTRACT

An ultra-fast drive circuit (40) providing a rail-to-rail drive voltage at an output node ($N_1$). A pair of bipolar output transistors ($Q_3$, $Q_4$) are selectively driven via a FET drive circuit (42), and by a control circuit (44) to achieve a rail-to-rail output voltage ($V_{cc}$-$V_{ee}$) that is very fast. The drive FETs comprise three serially connected FETs ($M_5$, $M_6$, $M_7$) whereby the middle FET ($M_6$) is the control FET effecting the control of the output transistors ($Q_3$, $Q_4$). The other two FETs ($M_5$, $M_7$) are always in the on state and complete either the pull-up or pull-down of the voltage at the output node ($N_1$), depending on the state of the middle FET ($M_6$). The control FETs (44) provide two output control signals (46, 48) to the output transistors ($Q_3$, $Q_4$), with the control line (48) controlling the state of the middle switching FET ($M_6$).

20 Claims, 3 Drawing Sheets

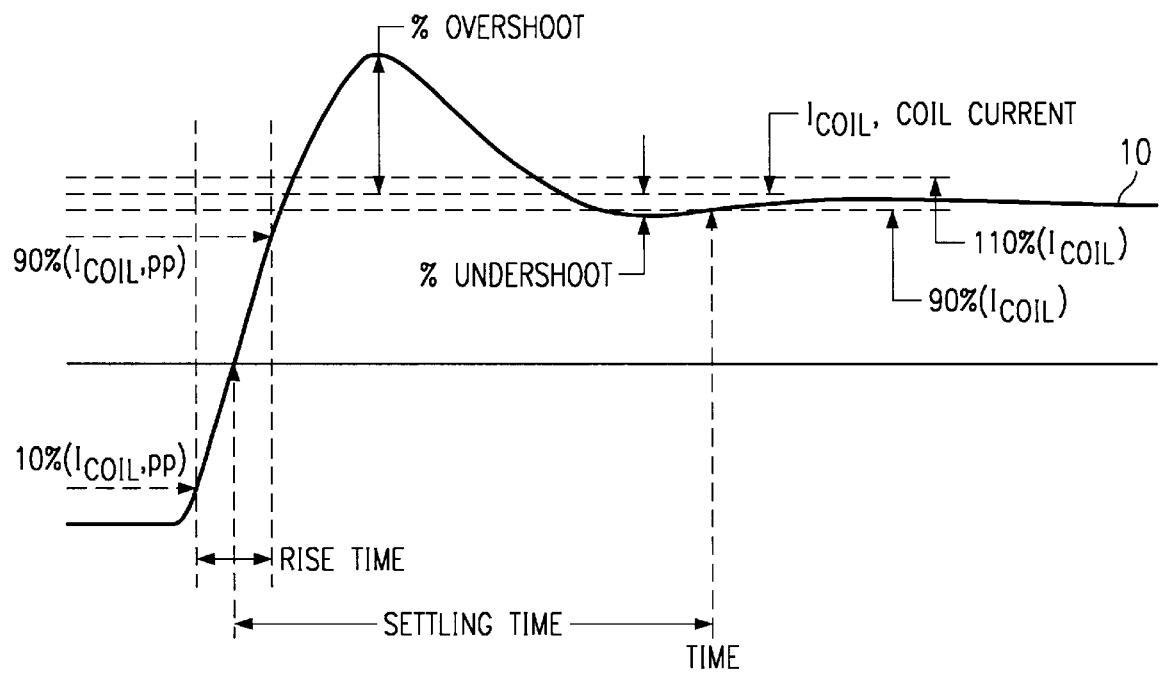
FIG. 1
*(CONVENTIONAL)*
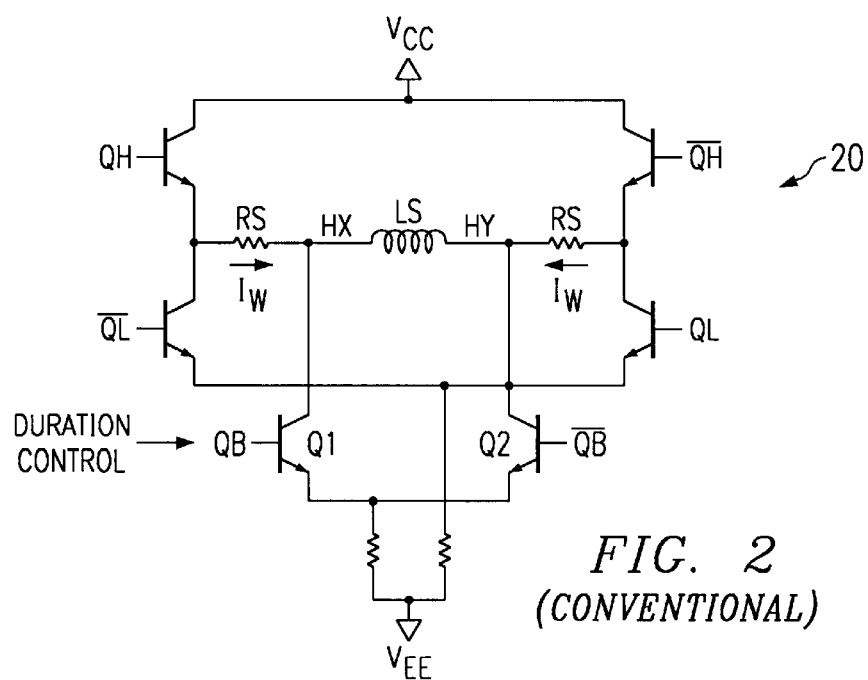
FIG. 2
*(CONVENTIONAL)*

ULTRA-FAST VOLTAGE DRIVE

CROSS REFERENCE TO RELATED APPLICATIONS

Cross reference is made to commonly assigned U.S. patent application Ser. No. 09/772,770 entitled "Enhanced Voltage Drive Circuit for HDD Write Drive," filed herewith and the teachings incorporated herein by reference.

FIELD OF THE INVENTION

The present invention is generally related to mass media drive controllers, including HDD drives, and more particularly to an ultra-fast voltage drive for a write drive control circuit controlling the head of the drive.

BACKGROUND OF THE INVENTION

The coil current waveform characteristics that are important in a HDD voltage write driver circuit are depicted at 10 in FIG. 1. In particular, the current rise time, overshoot, undershoot, and settling time are of particular interest. Desired characteristics for the coil current waveform are a fast rise time and settling time, a controllable amount of overshoot, and very little undershoot. By achieving these characteristics, a hard disk drive storage capacity can be improved.

A conventional voltage source based write coil driver circuit is shown at 20 in FIG. 2. A coil is modeled as LS, and is connected to four transistors via coil node HX and node HY. The connection of the four transistors to the coil is known conventionally as an H-bridge. The coil is typically referred to as the head. The H-bridge controls the direction of the coil current $I_w$, known as a coil current reversal, to responsively create magnetic flux changes through the coil.

One limitation of this conventional voltage source based write coil driver 20 is the differential transient voltage generated at nodes HX and HY conventionally known as (TRTF), driving a current reversal. This limitation can be appreciated in conventional circuit 20 shown in FIG. 2, whereby the voltage of one node can be momentarily pulled down, such as node HX, to near the second voltage rail $V_{ee}$ using transistor $Q_1$. However, and disadvantageously, there is no circuit to pull up the other node, such as node HY. Thus, the voltage at each node can go no higher than established that are expressed by the following equation:

$$V_{node}=V_{cc}-(V_{be}+RS\times I_w).$$

The coil current $I_w$ has a nominal current of about 40 milliamps with control signals QL or $\overline{QL}$. However, during current reversal of the coil, transistors $Q_1$ or $Q_2$ are temporarily turned on to "boost" normal current and decrease the differential voltage TRTF. It can be appreciated that transistors $Q_1$ and $Q_2$ bypass half of the matched impedance resistors RS during this "boost," however, the other series resistor RS is still in the current path. Thus, the above equation represents the maximum voltage that one node can attain when the other node is pulled down close to $V_{ee}$.

There is desired an improved circuit that improves the speed of a rail-to-rail drive circuit, and which includes drive circuit providing a rail-to-rail drive voltage to large PMOS FETs pulling-up a voltage at nodes HX and HY.

SUMMARY OF THE INVENTION

The present invention achieves technical advantages as a rail-to-rail ultra-fast voltage drive circuit providing a rail-to-rail drive voltage to a subsequent drive circuit, such as a HDD write driver control circuit. The voltage drive circuit has a pair of serially connected output transistors driven by a control circuit such that an output voltage defined at an output node between the two output transistors is driven fast rail-to-rail.

This control circuit preferably comprises three serially connected FETs coupled between the voltage rails, whereby the middle FET controls the voltage at the output node. The other two FETs are coupled to a respective voltage rail, and each have their gates connected to the opposing rail. This gate xying arrangement reduces the number and size of the devices required in this control circuit, and further speeds up the rail-to-rail voltage swings of the drive circuit.

BRIEF DESCRIPTION OF THE DRAWINGS

FIG. 1 is a waveform diagram of a conventional coil current waveform characteristics including the rise time associated with a current reversal of a drive circuit;

FIG. 2 is a schematic diagram of a conventional HDD drive circuit;

DETAILED DESCRIPTION OF THE PREFERRED EMBODIMENT

Figure 3:
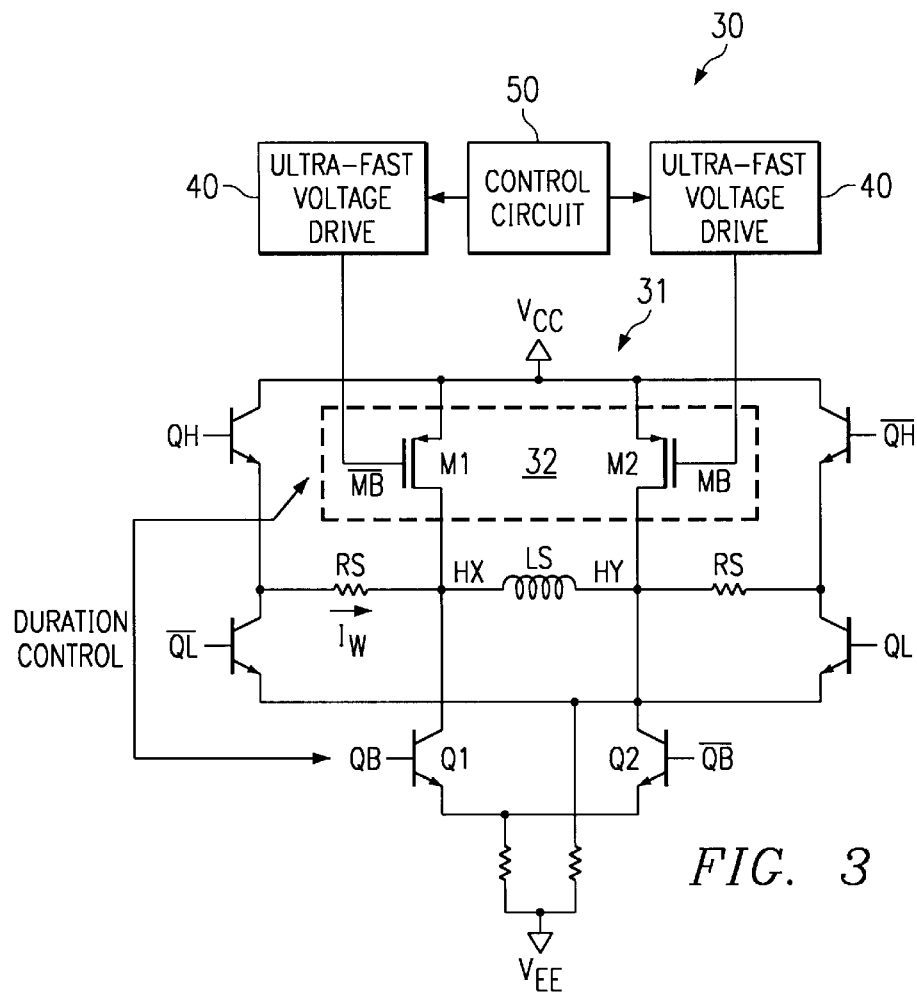
FIG. 3 is a schematic diagram of the present invention including the ultra-fast voltage drive circuit finding advantages with a HDD write coil driver circuit.

Referring now to FIG. 3, there is illustrated generally at 30 a write driver control circuit 31 and a pair of ultra-fast voltage drive circuits 40 controlled by a control circuit shown at 50. Each of these ultra-fast voltage drive circuits 40, shown in detail in FIG. 4, provide an ultra-fast, rail-to-rail drive voltage to the large PMOS boost FETs shown at 32, thereby achieving the advantages of getting maximum voltage swing from the PMOS devices 32, with a very quick voltage swing from one rail to the other.

For more detailed understanding of the HDD drive circuit shown at 31, cross-reference is made to commonly assigned co-pending patent application Attorney's Docket number TI-32302 entitled "Enhanced Voltage Drive Circuit for HDD Write Driver," filed herewith and the teachings incorporated herein by reference.

Figure 4:
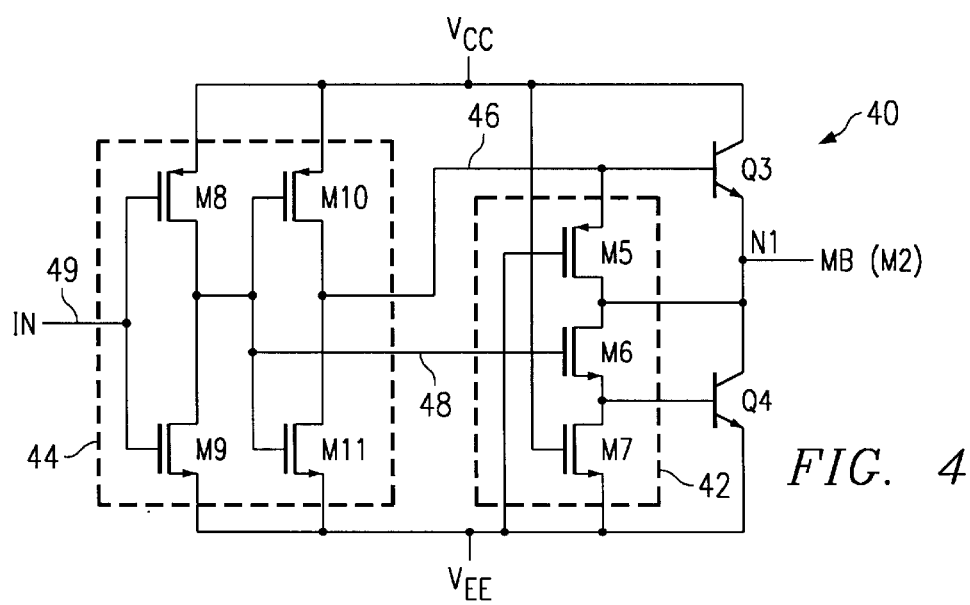
FIG. 4 is a detailed schematic diagram of the ultra-fast voltage drive circuit illustrated in FIG. 2 providing an output voltage at an output node that quickly swings from rail-to-rail, that is, from $V_{cc}$ to GND.
Figure 5:
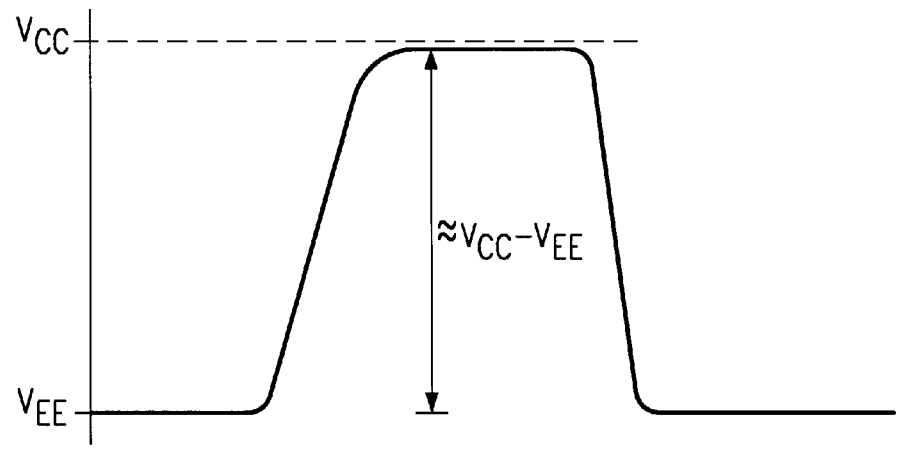
FIG. 5 is a signal diagram of the output voltage swing at node $N_1$.
Figure 6:
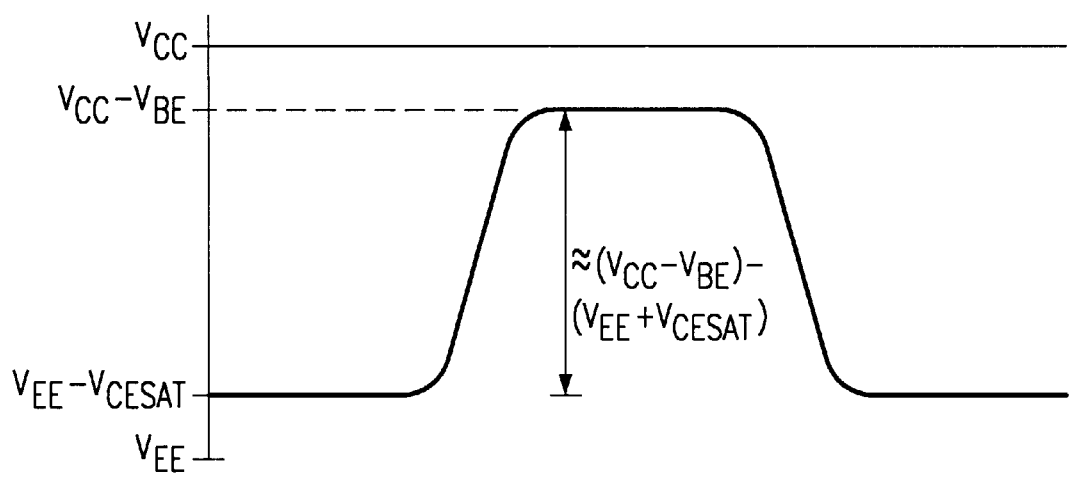
FIG. 6 is a signal diagram of the output voltage swing at node $N_1$ without using FETs $M_5$, $M_6$ and $M_7$.

Turning now to FIG. 4, there is shown at 40 one of the PMOS voltage drive circuits seen too include a pair of serially connected bipolar output transistors $Q_3$ and $Q_4$ having an output node $N_1$ defined therebetween. This output node $N_1$ is connected to the gate of the respective voltage pull-up FET, either $M_1$ or $M_2$, as shown in FIG. 3. Transistor $Q_4$ is a Schottky transistor to obtain a low $V_{cesat}$. Control circuit 50, during a current reversal, selectively controls one of the voltage drive circuits 40 to drive the gate of the respective $M_1$ or $M_2$ FET hard. As described in the co-pending patent application, during a current reversal, transistors $Q_1$ and $M_2$ will be on with the other transistors $Q_2$ and $M_1$ off, and for the next current reversal, transistors $Q_2$ and $M_1$ will be on, with the other transistors $Q_1$ and $M_2$ being off. The respective "boost" FETs shown at 32, when on, will pull the voltage at the corresponding node HX or HY high to $V_{cc}$, with the other corresponding node is being pulled low near $V_{ee}$ by the other transistor $Q_1$ or $Q_2$ that is on.

Referring back to FIG. 4, the PMOS drive circuit 40 is seen to include a control circuit 42 comprised of three serially connected FETs shown as $M_5$, $M_6$, and $M_7$, with the middle or second FET $M_6$ residing therebetween. The node defined between FETs $M_5$ and $M_6$ is tied to the output node $N_1$, with the node defined between FETs $M_6$ and $M_7$ being connected to the base of output bipolar Schottky transistor $Q_4$. The source of FET $M_7$ is seen to be tied to the second lower voltage rail having potential GND. The source of the FET $M_5$ is connected to the upper voltage rail $V_{cc}$ via FET $M_{10}$.

Also shown is that the gate of FET $M_5$ is connected to the lower voltage rail GND, with the gate of FET $M_7$ being connected to the positive voltage rail $V_{cc}$. FET $M_5$, therefore, is controlled by source voltage, not gate, and switches faster because FET $M_7$ is always on. Advantageously, this transistor arrangement reduces the switching time for a rail-to-rail voltage swing, and also reduces the number of components required.

Advantageously, FET $M_6$ and $M_7$, when on, form a resistive divider to drive transistor $Q_4$. Transistor $Q_4$ is a Schottky device to obtain low $V_{cesat}$. Controls the output voltage swing at the output node $N_1$. Specifically, a control circuit generally shown at 44 has a first output shown as control line 46 being connected to the base of the first output transistor $Q_3$, and source of transistor $M_5$, and a second, complementary, output single line 48 being connected to the gate of control FET $M_6$. Control line 46 operates such that a logic "high" signal provided on signal line 46 turns on output transistor $Q_3$ and FET $M_5$, whereby the complementary logic "low" signal on output single line 48 keeps control FET $M_6$ off and consequently keeps transistor $Q_4$ off due to transistor $M_7$. Similarly, a logic "low" on control line 46 shuts transistor $Q_3$ and $M_5$ off, with a complementary logic "high" signal on control line 48 turning control FET $M_6$ on, thereby turning on the output transistor $Q_4$ temporarily through the resistor divider. Transistor $Q_3$ and $Q_4$ are used to drive the output node, $N_1$, hard with large current sourcing and sinking capabilities but unable to drive rail-to-rail. $Q_4$ can't pull node $N_1$ all the way to GND, and transistor $Q_3$ can't pull node $N_1$ all the way to VCC. FET $M_5$ is used to pull node $N_1$ up to $V_{cc}$ toward the end of the transition, while FETS $M_6$ and $M_7$ are used to pull node $N_1$ to GND at the end of the opposite transition.

$V_{cc}$ Voltage Provided to Output Node $N_1$

When a logic "high" signal is provided to the input signal line shown at 49, the control circuit 44 provides a logic "high" to control line 46 such that output transistor $Q_3$ is on, which initially pulls the output voltage at output node $N_1$ to within approximately 0.7 volts of the first rail $V_{cc}$. A logic "low" is provided on output control line 48 such that control FET $M_6$ is "off." Advantageously, FET $M_5$ becomes "on" before $Q_3$ stops providing drive current to complete the Vcc rail swing.

GND Rail Provided to Output Node $N_1$

When a logic "low" signal is provided to input line 49, a logic "low" output signal is provided to output line 46, and logic "high" signal is provided to output line 48. Thus, output transistor $Q_3$ is responsively in the "off" state, control FET $M_6$ is in the "on" state, and output transistor $Q_4$ is in the on state and pulls down the output voltage at node $N_1$ to within 0.4 volts of the lower rail GND. Advantageously, since FET $M_7$ is in the "on" state, FET $M_7$ will pull the voltage at the output node $N_1$ completely to the lower rail GND, such as zero volts.

Notably, if a conventional control circuit including only output transistors $Q_3$ and $Q_4$ were provided, FETs $M_5$ and $M_6$ could be deleted. However, this is counter to the goal of the present invention of which is to drive the gates of the large PMOS of FETs 32 rail-to-rail, quickly, and providing strong driving capabilities. The combination and configuration of the three drive FETs $M_5$, $M_6$, and $M_7$ are used to controllably and quickly drive the output node $N_1$ rail-to-rail, that is from $V_{cc}$ to GND and back again as a function of the control signal provided to the input line 49. Again, FET $M_7$ is always in the "on" state and FET $M_5$ is controlled by its source to minimize the number and size of the devices required in this circuit 40. Rather, only the middle FET $M_6$ and node 46 is selectively controlled to responsively effect the control of output transistors $Q_3$ and $Q_4$, whereby FETs $M_5$ and $M_6$-$M_7$ complete either the pull-up or the pull-down of voltage at the output node $N_1$.

Though the invention has been described with respect to a specific preferred embodiment, many variations and modifications will become apparent to those skilled in the art upon reading the present application. It is therefore the intention that the appended claims be interpreted as broadly as possible in view of the prior art to include all such variations and modifications.

We claim:

1. A rail-to-rail drive circuit, comprising:
   a first voltage rail;
   a second voltage rail;
   a first and second output transistor coupled in series between said first and second voltage rail and having an output node defined therebetween; and
   a drive circuit drivingly coupled to said first and second output transistor to selectively swing a voltage at said output node between said first voltage rail and said second voltage rail;
   wherein said drive circuit comprises a plurality of FETs;
   wherein a first set of said FETs are coupled in series between said first voltage rail and said second voltage rail; and
   wherein said first set of said FETs comprise a first FET, a second FET, and a third FET coupled in series between said first voltage rail and said second voltage rail.

2. The rail-to-rail drive circuit of claim 1 wherein said second FET is the middle FET of said series, further comprising a control circuit selectively driving said second FET to responsively establish either said first rail voltage or said second rail voltage at said output node.

3. The rail-to-rail drive circuit of claim 2 wherein said first FET is coupled to said first rail voltage and has a gate connected to said second rail voltage.

4. The rail-to-rail drive circuit of claim 3 wherein said third FET is coupled to said second rail voltage and has a gate connected to said first rail voltage.

5. The rail-to-rail drive circuit of claim 2 wherein said control circuit also selectively drives said first output transistor and said second output transistor.

6. The rail-to-rail drive circuit of claim 5 wherein said control circuit has a first control output controlling said first output transistor, and a second complimentary control output controlling both said second FET and said second output transistor.

7. The rail-to-rail drive circuit of claim 6 wherein said control circuit comprises a first and second control FET coupled in series between said first voltage rail and said second voltage rail and having a first control output defined therebetween and commonly connected gates, and a third and fourth control FET coupled in series between said first voltage rail and said second voltage rail having a second control output defined therebetween, being connected to said first output transistor, and commonly connected gates connected to said first control output and said second FET.

8. The rail-to-rail drive circuit of claim 5 where in said control circuit also comprises of FETs.

9. A rail-to-rail drive circuit comprising:
   a first voltage rail;
   a second voltage rail;
   a first and second output transistor coupled in series between said first and second voltage rail and having an output defined therebetween;
   a first drive circuit coupled to said first and second output transistor to selectively swing a voltage at said output between said first voltage rail and said second voltage rail; and
   a write drive circuit responsively driven by said voltage at said output and comprising:
      an H-bridge drive circuit coupled between said first voltage rail and said second voltage rail having a first and second drive transistor coupled together at a first node, and a third and fourth drive transistor coupled together at a second node;
      a coil;
      a first resistor coupled between said first node and a third node defined at one end of said coil, and a second resistor coupled between said second node and a fourth node defined at the other end of said coil; and
      a second drive circuit coupled to said third node and said fourth node selectively pulling said third node and said fourth node to substantially said first voltage rail.

10. The driver circuit of claim 9 wherein said drive circuit further comprises a fifth transistor coupled between said third node and said second voltage rail and a sixth transistor coupled between said fourth node and said second voltage rail.

11. The drive circuit of claim 10 wherein said drive circuit drives said third node as a function of operation of said sixth transistor, and driving said fourth node as a function of operation of said fifth transistor.

12. The drive circuit of claim 11 wherein said drive circuit drives said third node while said sixth transistor is driven, and drives said fourth node while said fifth transistor is driven.

13. The drive circuit of claim 9 wherein said third node and said fourth node are selectively pulled to within 0.2 volts of said first voltage rail.

14. The drive circuit of claim 9 wherein said drive circuit comprises a first FET coupled between said first voltage rail and said third node, and a second FET coupled between said first voltage rail and said fourth node.

15. The drive circuit of claim 14 wherein said first FET is momentarily driven during a current reversal of said coil.

16. The drive circuit of claim 14 wherein said first FET and said second FET are PMOS devices.

17. The drive circuit of claim 14 wherein said first resistor does not pull-down a voltage at said third node when said first FET is driven.

18. The drive circuit of claim 17 wherein said second resistor does not pull-down a voltage at said fourth node when said second FET is driven.

19. The drive circuit of claim 14 wherein said first FET bypasses said first resistor during a current reversal of said coil, and said second FET bypasses said second resistor during a current reversal of said coil.

20. The drive circuit of claim 14 wherein said first voltage rail is a positive with respect to said second rail.

* * * * *